(12) United States Patent
Otsu et al.

(10) Patent No.: US 11,522,535 B2
(45) Date of Patent: Dec. 6, 2022

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventors: Hibiki Otsu, Kawasaki Kanagawa (JP); Shuji Toda, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/405,892

(22) Filed: Aug. 18, 2021

(65) Prior Publication Data

US 2022/0286124 A1    Sep. 8, 2022

(30) Foreign Application Priority Data

Mar. 2, 2021    (JP) .............................. JP2021-032651

(51) Int. Cl.
| | |
|---|---|
| *H02M 1/32* | (2007.01) |
| *H02M 3/07* | (2006.01) |
| *H03K 3/00* | (2006.01) |
| *H03K 17/687* | (2006.01) |
| *H03K 17/14* | (2006.01) |

(52) U.S. Cl.
CPC ......... *H03K 17/145* (2013.01); *H03K 17/687* (2013.01); *H03K 2217/0081* (2013.01)

(58) Field of Classification Search
None
See application file for complete search history.

(56) References Cited

U.S. PATENT DOCUMENTS

| | | | |
|---|---|---|---|
| 7,554,305 B2 * | 6/2009 | Nunokawa | .............. G05F 1/575 |
| | | | 323/273 |
| 9,124,272 B2 * | 9/2015 | Fukami | .................... H02M 3/07 |
| 9,729,150 B2 * | 8/2017 | Ishimatsu | .......... H03K 19/0016 |
| 9,973,082 B1 | 5/2018 | Nakagawa | |
| 10,658,831 B2 | 5/2020 | Takuma et al. | |

(Continued)

FOREIGN PATENT DOCUMENTS

| | | |
|---|---|---|
| JP | 2001-257575 A | 9/2001 |
| JP | 3966099 B2 | 8/2007 |

(Continued)

*Primary Examiner* — Kenneth B Wells
(74) *Attorney, Agent, or Firm* — Allen & Overy LLP (57) ABSTRACT

According to one embodiment, a semiconductor device includes a first terminal, a second terminal, and a first circuit. The first circuit includes a first switch element having a first end coupled to a first node to which a first voltage is supplied, a second end coupled to the first terminal, and a gate coupled between the first node and the second terminal, and a second switch element coupled between the first node and the first terminal. The first circuit is configured to switch the first switch element from OFF state to ON state when supply of the first voltage is interrupted, and switch the second switch element from OFF state to ON state while maintaining the first switch element in ON state when a voltage of the first terminal changes to a second voltage.

13 Claims, 5 Drawing Sheets

(56) References Cited

U.S. PATENT DOCUMENTS

| | | | |
|---|---|---|---|
| 10,756,728 B2* | 8/2020 | Mori | H03K 17/04206 |
| 11,070,127 B2* | 7/2021 | Iwamizu | H02M 3/07 |
| 2019/0190512 A1 | 6/2019 | Takuma | |

FOREIGN PATENT DOCUMENTS

| | | |
|---|---|---|
| JP | 4632415 B2 | 2/2011 |
| JP | 2017-022684 A | 1/2017 |
| JP | 2018-026963 A | 2/2018 |
| JP | 2018-078498 A | 5/2018 |
| JP | 2019-110521 A | 7/2019 |
| JP | 2020-031449 A | 2/2020 |

* cited by examiner

SEMICONDUCTOR DEVICE

CROSS-REFERENCE TO RELATED APPLICATIONS

This application is based upon and claims the benefit of priority from Japanese Patent Application No. 2021-032651, filed Mar. 2, 2021, the entire contents of which are incorporated herein by reference.

FIELD

Embodiments described herein relate generally to a semiconductor device.

BACKGROUND

Semiconductor devices for driving a load have been known.

DETAILED DESCRIPTION

In general, according to one embodiment, a semiconductor device includes a first terminal, a second terminal, and a first circuit. The first circuit comprises a first switch element having a first end coupled to a first node to which a first voltage is supplied, a second end coupled to the first terminal, and a gate coupled between the first node and the second terminal, and a second switch element coupled between the first node and the first terminal in parallel to the first switch element, and having a gate coupled to the first terminal, and wherein the first circuit is configured to switch the first switch element from an OFF state to an ON state when supply of the first voltage to the first node is interrupted, and switch the second switch element from the OFF state to the ON state while maintaining the first switch element in the ON state when a voltage of the first terminal changes to a second voltage that is lower than the first voltage.

The embodiments will be explained below by referring to the drawings. In the following explanation, components having the same functions and structures will be referred to by the same reference symbols.

1. Embodiment

A semiconductor device according to the present embodiment will be explained.

The semiconductor device according to the present embodiment is a driver configured to supply a voltage for driving a load such as a switch element. The semiconductor device according to the present embodiment may be an integrated circuit. (IC) chip.

1.1 Configuration

Figure 1:
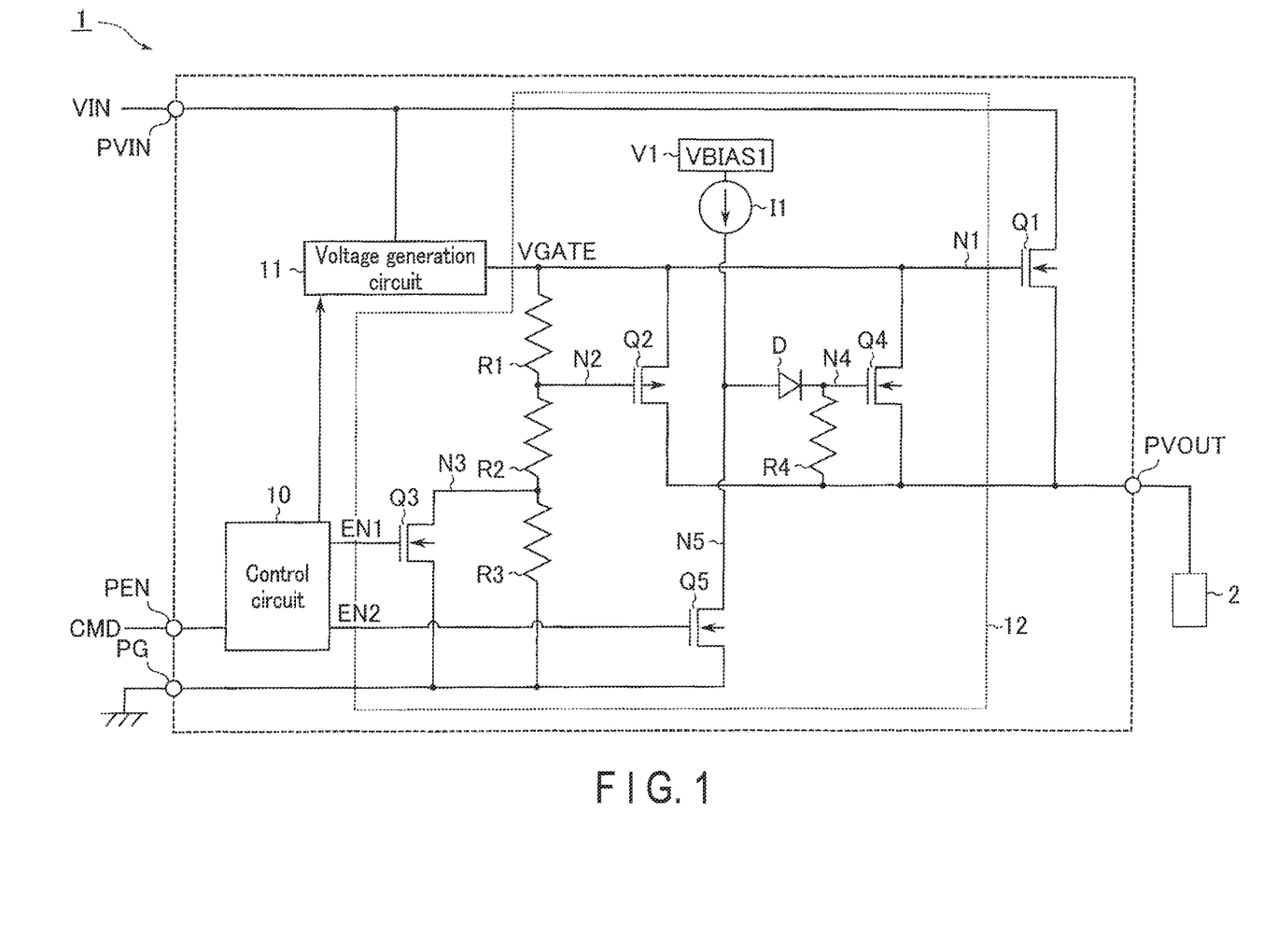
FIG. 1 is a circuit diagram for explaining an exemplary configuration of a semiconductor device according to the present embodiment and a load driven by the semiconductor device.

The configuration of the semiconductor device according to the present embodiment will be explained with reference to FIG. 1, which is a circuit diagram for explaining an exemplary configuration of the semiconductor device according to the present embodiment and the switch element driven by the semiconductor device.

The semiconductor device 1 is configured to supply, to a load 2 external to the semiconductor device 1, power for driving the load 2.

The semiconductor device 1 includes a control circuit 10, a voltage generation circuit 11, a switching circuit 12, and a switch element Q1. The switch element Q1 is an N-channel MOSFET. The semiconductor device 1 includes terminals PVIN, PVOUT, PEN, and PG.

A voltage VIN is applied to the first end of the switch element Q1 by way of the terminal PVIN. The voltage VIN is supplied to the semiconductor device 1 from the outside of the semiconductor device 1 in order to drive the load 2. The gate of the switch element Q1 is coupled to the voltage generation circuit 11 by way of a node N1. The second end of the switch element Q1 is coupled to the load 2 by way of the terminal PVOUT. The switch element Q1, when it is in the ON state, outputs a voltage VIN to the load 2 via the terminal PVOUT.

The control circuit 10 receives a command CMD from the outside of the semiconductor device 1, for example via the terminal PEN. The command CMD may include a command CMD for causing the semiconductor device 1 to drive the load 2 and a command CMD for causing the semiconductor device 1 to stop driving the load 2. In the following explanation, the operation of the semiconductor device 1 driving the load 2 may be referred to as an "ON operation", and the operation of the semiconductor device 1 stopping driving the load 2 may be referred to as an "OFF operation". The command for causing the semiconductor device 1 to drive the load 2 may be referred to as an ON-operation command CMD, and the command for causing the semiconductor device 1 to stop driving the load 2 may be referred to as an OFF-operation command CMD.

The control circuit 10 controls the voltage generation circuit 11 based on the received command CMD as described above. In particular, upon receipt of an ON-operation command CMD, the control circuit 10 instructs the voltage generation circuit to generate a voltage for turning on the switch element Q1. Furthermore, upon receipt of an OFF-operation command CMD, the control circuit 10 instruct the voltage generation circuit 11 to stop generating the voltage for turning on the voltage switch element Q1.

The control circuit 10 generates signals EN1 and EN2 based on the received command CMD. In particular, upon receipt of an ON-operation command CMD, the control circuit 10 generates a signal EN1 at the "L (low)" level and a signal EN2 at the "H (high)" level. Upon receipt of an OFF-operation command CMD, the control circuit 10 generates a signal ENI at the "H" level and a signal EN2 at the "L" level. The control circuit 10 outputs the generated signals EN1 and EN2 to the switching circuit 12.

The voltage VIN is applied to the voltage generation circuit 11 by way of the terminal PVIN from the outside of the semiconductor device 1. Based on the command from the control circuit 10, the voltage generation circuit 11 boosts the applied voltage VIN to a voltage VGATE. The voltage VGATE, which is higher than the voltage VIN, is the voltage used to turn on the switch element Q1. The voltage generation circuit 11 outputs the boosted voltage VGATE to the gate of the switch element Q1 by way of the node N1.

The switching circuit 12 is configured to switch the states (ON state and OFF state) of the switch element Q1 based on the signals EN1 and EN2.

The configuration of the switching circuit 12 will be explained in detail by referring to FIG. 1.

The switching circuit 12 includes switch elements Q1, Q2, Q3, Q4, and Q5, resistors R1, R2, R3, and R4, a constant voltage source V1, a constant current source I1, and a diode D. The switch element Q2 is a P-channel MOSFET, and the switch elements Q3, Q4, and Q5 are N-channel MOSFETs.

The first end of the switch element Q2 is coupled to the node N1. The gate of the switch element Q2 is coupled to the node N2. The second end of the switch element Q2 is coupled to the terminal PVOUT.

The first end of the switch element Q3 is coupled to the node N3. The signal EN1 is input to the gate of the switch element Q3. The second end of the switch element Q3 is grounded by way of the terminal PG. When the signal EN1 is at the "H" level, the switch element Q3 enters the ON state. When the signal EN1 is at the "L" level, the switch element Q3 enters the OFF state.

The first end of the switch element Q4 is coupled to the node N1. The gate of the switch element Q4 is coupled to the node N4. The second end of the switch element Q4 is coupled to the terminal PVOUT.

The first end of the switch element Q5 is coupled to the node N5. The signal EN2 is input to the gate of the switch element Q5. The second end of the switch element Q5 is grounded by way of the terminal PG. When the signal EN2 is at the "H" level, the switch element Q5 enters the ON state. When the signal EN2 is at the "L" level, the switch element Q5 enters the OFF state.

The first end of the resistor R1 is coupled to the node N1, and the second end of the resistor R1 is coupled to the node N2.

The first end of the resistor R2 is coupled to the node N2, and the second end of the resistor R2 is coupled to the node N3.

The first end of the resistor R3 is coupled to the node N3, and the second end of the resistor R3 is grounded by way of the terminal PG.

The first end of the resistor R4 is coupled to the node N4, and the second end of the resistor R4 is coupled to the terminal PVOUT.

The constant voltage source V1 outputs a voltage VBIAS1 to the constant current source I1.

The constant current source I1 passes a current to the node N5 based on the voltage VBIAS1 output from the constant voltage source V1.

The diode D is coupled between the node N5 and node N4 in a forward direction. That is, the anode of the diode D is coupled to the node N5, and the cathode of the diode D is coupled to the node N4. The diode D is driven by the constant current source I1 based on the voltages at the nodes N4 and N5. During the period of the diode D being driven, a difference voltage (VBIAS1−Vf), which is obtained by subtracting the forward voltage Vf of the diode D from the voltage VBIAS1, is applied to the node N4. The difference voltage (VBIAS1−Vf) is a positive voltage. When the diode D is not driven, the voltage of the node N4 is the same as the voltage of the terminal PVOUT. The difference voltage (VBIAS1−Vf) is lower than the voltage VIN, and is higher than the absolute value of the threshold voltage Vth(Q4) of the switch element Q4 (hereinafter simply referred to as "threshold voltage Vth(Q4)").

1.2 Operation

Figure 2:
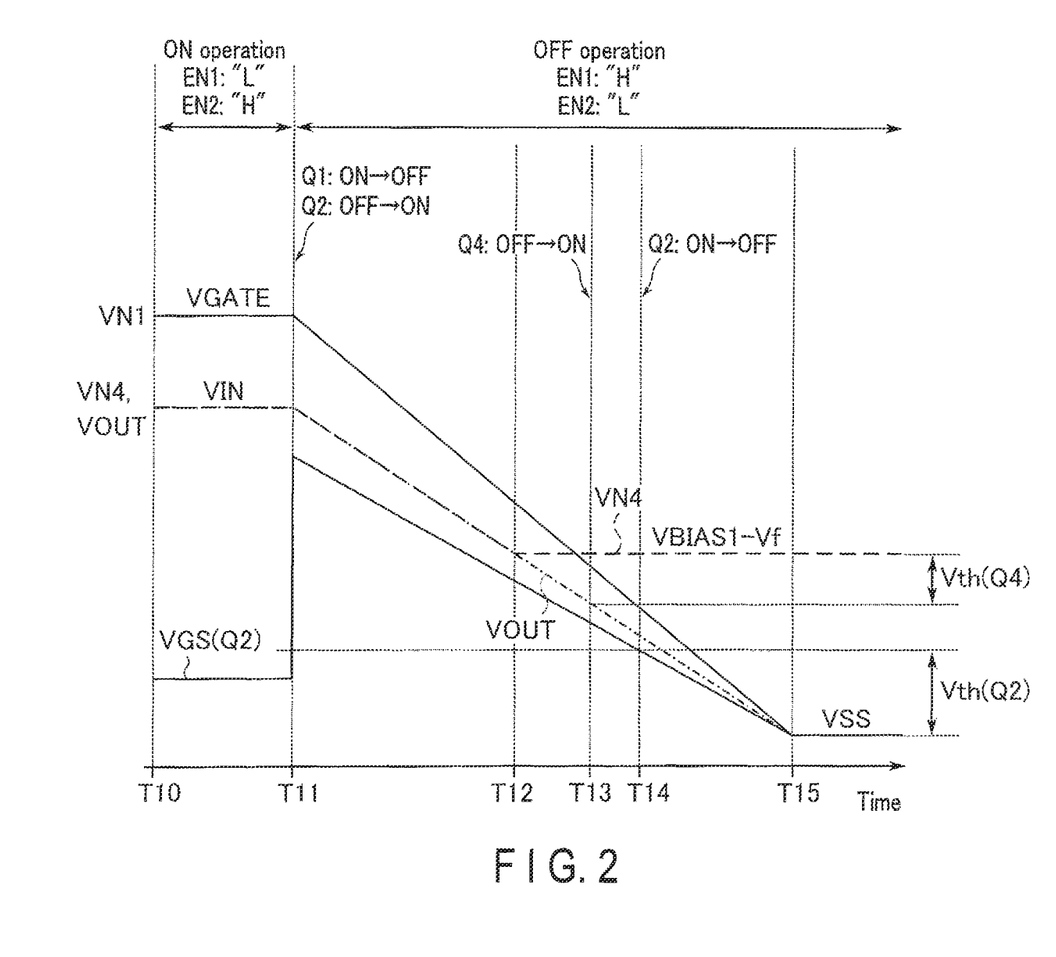
FIG. 2 is a timing chart for showing an exemplary operation using the semiconductor device according to the present embodiment.

The operation of the semiconductor device 1 according to the present embodiment will be explained with reference to FIG. 2, which is a timing chart for showing an exemplary operation using the semiconductor device 1 according to the present embodiment. In FIG. 2, the operation of the semiconductor device 1 receiving an OFF-operation command CMD after receiving an ON-operation command CMD is illustrated.

At time T10, the control circuit 10 of the semiconductor device 1 receives an ON-operation command CMD. Based on the ON-operation command CMD, the semiconductor device 1 drives the load 2.

In particular, in response to the instruction from the control circuit 10 based on the ON-operation command CMD, the voltage generation circuit 11 boosts the voltage VIN to the voltage VGATE. The voltage generation circuit 11 outputs this voltage VGATE to the node N1. The voltage VN1 of the node N1 thereby becomes approximately the same as the voltage VGATE.

Based on the ON-operation command CMD, the control circuit 10 generates an "L"-level signal EN1 (EN1: "L" in FIG. 2). Based on the "L"-level signal EN1, the switch element Q3 enters the OFF state. In the following explanation and in FIG. 2, the absolute value of the potential difference VGS(Q2) between the gate and first end of the switch element Q2 (simply referred to as "potential difference VGS(Q2)") when the switch element Q3 is in the OFF state is expressed with the voltage VN1 and the resistance values r1, r2, and r3 of the resistors R1, R2, and R3, as voltage (VN1×r1/(r1+r2+r3)). As mentioned earlier, the voltage VN1 during the ON operation is approximately the same as the voltage VGATE. The potential difference VGS(Q2) during the ON operation is therefore expressed as voltage (VGATE×r1/(r1+r2+r3)). The threshold voltage Vth(Q2) of the switch element Q2 satisfies the expression (1) below. That is, the threshold voltage Vth(Q2) of the switch element Q2 is higher than the potential difference VGS(Q2) in the ON operation. As a result, the switch element Q2 enters the OFF state.

$$VGATE \times r1/(r1+r2+r3) < Vth(Q2) \quad (1)$$

Based on the ON-operation command CMD, the control circuit 10 also generates an "H"-level signal EN2 (EN2: "H" in FIG. 2). Based on the "H"-level signal EN2, the switch element Q5 enters the ON state. The first end of the diode D (i.e., node N5) is thereby grounded, and the diode D is therefore not driven. Thus, the voltage VN4 at the node N4 (i.e., the gate of the switch element Q4) becomes approximately the same as the voltage VOUT at the terminal PVOUT (i.e., the second end of the switch element Q4). As a result, the switch element Q4 enters the OFF state.

As described above, during the ON operation, the node N1 and terminal PVOUT are electrically insulated from each other, with the switch elements Q2 and Q4 being in the OFF state. As a result, the switch element Q1 enters the ON state, based on the voltage VGATE applied to the node N1. That is, the voltage VIN input to the first end of the switch element Q1 is output to the load 2 via the terminal PVOUT.

At time T11, the semiconductor device 1 receives an OFF-operation command CMD. Based on the OFF-operation command CMD, the semiconductor device 1 stops driving the load 2.

In particular, in response to the instruction from the control circuit 10 based on the OFF-operation command CMD, the voltage generation circuit 11 stops boosting the voltage VIN. As a result, the voltage VN1 of the grounded node N1 begins to drop.

Based on the OFF-operation command CMD, the control circuit 10 generates an "H"-level signal EN1 (EN1: "H" in FIG. 2). Based on the "H"-level signal EN1, the switch element Q3 enters the ON state. When the switch element Q3 is in the ON state, the potential difference VGS(Q2) is expressed by using the voltage VN1, and resistance values r1 and r2, approximately as voltage (VN1×r1/(r1+r2)). The voltage VN1 immediately after switching from the ON operation to the OFF operation is approximately equal to the voltage VGATE. The potential difference VGS(Q2) at time T11 is therefore expressed as voltage (VGATE×r1/(r1+r2)). The threshold voltage Vth(Q2) of the switch element Q2 satisfies the expression (2) below. That is, the threshold voltage Vth(Q2) of the switch element Q2 is lower than the potential difference VGS(Q2) immediately after switching from the ON operation to the OFF operation. The switch element Q2 is therefore switched from the OFF state to the ON state (Q2: OFF→ON in FIG. 2). The node N1 and terminal PVOUT are thereby coupled to each other by way of the switch element Q2. As a result, the voltages VOUT and VN4 begin to drop in accordance with the lowering of the voltage VN1.

$$Vth(Q2)<VGATE \times r1/(r1+r2) \qquad (2)$$

The control circuit 10 further generates an "L"-level signal EN2 on the OFF-operation command CMD (EN2: "L" in FIG. 2). The switch element Q5 is switched to the OFF state based on the "L"-level signal EN2. The voltage VN5 of the node N5 thereby becomes approximately the same as the voltage VBIAS1. Here, the voltage VN4 and voltage VOUT immediately after switching from the ON operation to the OFF operation are approximately equal to the voltage VIN. In addition, as mentioned earlier, the voltage VIN is higher than the difference voltage (VBIAS1−Vf). Thus, the diode D is not driven. This means that the voltage VN4 is approximately equal to the voltage VOUT, and the switch element Q4 maintains the OFF state.

As described above, the node N1 and terminal PVOUT are electrically coupled to each other by way of the switch element Q2 at time T11. In other words, in accordance with the switch element Q2 entering the ON state, the switch element Q1 is switched from the ON state to the OFF state (Q1: ON→OFF in FIG. 2).

At time T12, the voltages VOUT and VN4 fall to a level lower than the difference voltage (VBIAS1−Vf), as a result of which the diode D is driven. The voltage VN4 of the node N4 is thereby fixed to the difference voltage (VBIAS1−Vf). The absolute value of the potential difference VGS(Q4) between the node N4 and terminal PVOUT (simply referred to as "potential difference VGS(Q4)" in the following explanation and in FIG. 2) is expressed as voltage ((VBIAS1−Vf)−VOUT). Here, the potential difference VGS(Q4) at time T12 is lower than the threshold voltage Vth(Q4) of the switch element Q4. The switch element Q4 is therefore maintained in the OFF state.

At time T13, in accordance with the lowering of the voltage VOUT, the potential difference VGS(Q4) becomes higher than the threshold voltage Vth(Q4) of the switch element Q4. This switches the switch element Q4 from the OFF state to the ON state (Q4: OFF→ON in FIG. 2). The node N1 and terminal PVOUT are therefore electrically coupled to each other by way of the switch element Q4 in addition to the switch element Q2. With the switch elements Q2 and Q4 being in the ON state, the switch element Q1 is maintained in the OFF state.

At time T14, with the lowering of the voltage VN1, the potential difference VGS(Q2) (voltage (VN1×r1/(r1+r2))) becomes lower than the threshold voltage of the switch element Q2. As a result, the switch element Q2 is switched from the ON state to the OFF state (Q2: ON→OFF in FIG. 2). On the other hand, the potential difference VGS(Q4) (voltage ((VBIAS1−Vf)−VOUT)) increases as the voltage VOUT is lowered. As a result, the switch element Q4 is maintained in the ON state, and the node N1 and terminal PVOUT are therefore electrically coupled to each other by way of the switch element Q4. With the switch element Q4 being in the ON state, the switch element Q1 is maintained in the OFF state.

At time T15, the voltages VOUT and VN1 are lowered to a ground potential VSS.

As described above, during the ON operation, the semiconductor device 1 switches the switch element Q1 to the ON state in response to an ON-operation command CMD. In particular, the switch elements Q2 and Q4 are both configured to be in the OFF state during the ON operation. As a result, the gate of the switch element Q1 (i.e., node N1) and second end of the switch element Q1 (i.e., terminal PVOUT) are electrically insulated from each other. The switch element Q1 is thereby switched to the ON state based on the voltage VGATE of the node N1. That is, the voltage VIN input to the first end of the switch element Q1 is transferred to the load 2 by way of the terminal PVOUT.

During the OFF operation, the semiconductor device 1 is configured to switch at least one of the switch elements Q2 and Q4 to the ON state based on an OFF-operation command CMD so that the switch element Q1 can be switched to the OFF state. In particular, at the time of switching from the ON operation to the OFF operation, the semiconductor device 1 is configured to switch the switch element Q2 from the OFF state to the ON state. The semiconductor device 1 is further configured to, during the OFF operation, switch the switch element Q4 from the OFF state to the ON state before the switch element Q2 is switched from the ON state back to the OFF state. The semiconductor device 1 is also configured to, after switching the switch element Q4 from the OFF state to the ON state, maintain the switch element Q4 in the ON state until the semiconductor device 1 receives an ON-operation command CMD. With such a configuration, the node N1 and terminal PVOUT are electrically coupled to each other during the OFF operation, and therefore no potential difference appears between the node N1 and terminal PVOUT (i.e., basically becoming 0V). Thus, during the OFF operation, the switch element Q1 maintains the OFF state, and the transfer of the voltage VIN to the load 2 is interrupted.

1.3. Effects of Present Embodiment

The semiconductor device 1 according to the present embodiment includes a terminal PVOUT, a terminal PG, and a switching circuit 12. The switching circuit 12 includes switch elements Q2 and Q4. The switch elements Q2 and Q4 are coupled in parallel between the node N1, to which a voltage VGATE is supplied, and the terminal PVOUT. The node N1 is coupled to the gate of the switch element Q1. The terminal PVOUT is coupled to the second end of the switch element Q1. The gate of the switch element Q2 is coupled between the node N1 and terminal PG. The gate of the switch element Q4 is coupled to the terminal PVOUT. The switching circuit 12 switches the switch element Q2 to the ON state when the supply of the voltage VGATE to the node N1 is interrupted (at the time of switching from the ON operation to the OFF operation). The switching circuit 12 is further configured to switch the switch element Q4 from the OFF state to the ON state, while maintaining the switch element Q2 in the ON state, when the voltage of the terminal PVOUT becomes a voltage (VBIAS1−Vf−Vth(Q4)), which is obtained by subtracting the threshold voltage Vth(Q4) of the switch element Q4 from the difference voltage (VBIAS−Vf) (in other words, when the potential difference VGS(Q4) becomes approximately the same as the threshold voltage Vth(Q4)). In this manner, at least one of the switch elements Q2 and Q4 can be in the ON state during the OFF operation. This means that the node N1 and terminal PVOUT are electrically coupled to each other, and the switch element Q1 is maintained in the OFF state during the OFF operation. Thus, unintended power supply from the semiconductor device 1 to the load 2 external to the semiconductor device 1 can be avoided during the OFF operation.

2. Modification Example

Figure 3:
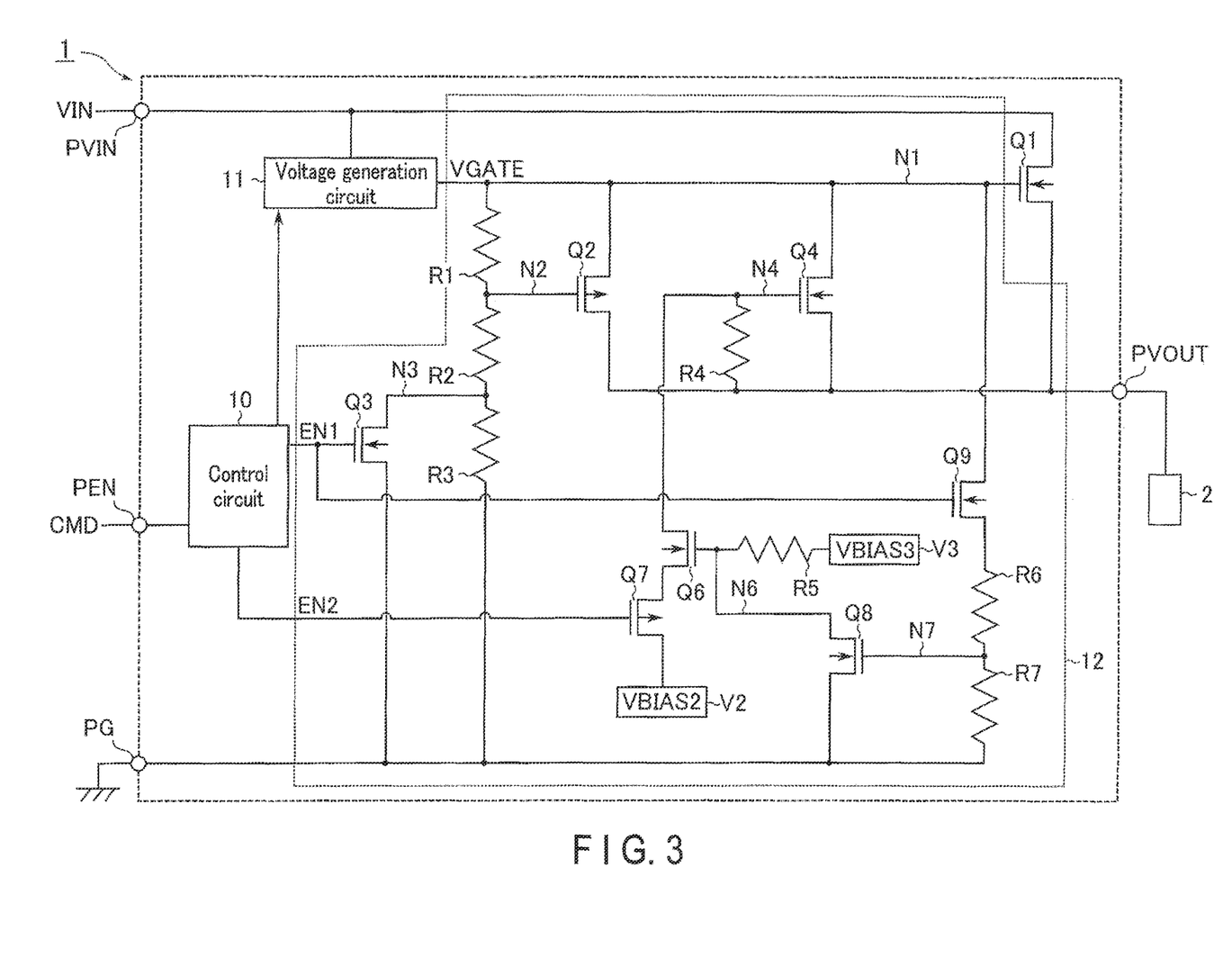
FIG. 3 is a circuit diagram for explaining an exemplary configuration of a semiconductor device according to a modification example and a load driven by the semiconductor device.

Next, a semiconductor device according to a modification example will be explained. This modification. example differs from the embodiment in that the switching circuit 12 electrically couples the node N1 and terminal PVOUT to each other in a configuration that does not include a diode D. The parts of the configuration and operation that are the same as in the embodiment will be omitted from the explanation, and the parts of the configuration and operation that differ from that of the embodiment will be mainly focused on.

2.1 Configuration

The configuration of the semiconductor device 1 according to the modification example will be explained.

The configurations of the terminals PVIN, PVOUT, PEN, PG, control circuit 10, voltage generation circuit 11, and switch element Q1 are the same as the configurations of the corresponding components of the embodiment, and therefore the explanation of these components will be omitted. In the following explanation, the configuration of the switching circuit 12 according to the modification example will be mainly focused on.

With reference to FIG. 3, the circuit structure of the switching circuit 12 according to the modification example will he explained. FIG. 3 is a circuit diagram explaining an exemplary configuration of a semiconductor device according to a modification example and a switch element driven by this semiconductor device.

The switching circuit 12 according to the modification example includes switch elements Q2, Q3, Q4, Q6, Q7, Q8, Q9, resistors R1, R2, R3, R4, R5, R6, R7, and constant voltage sources V2 and V3. The configurations of the switch element Q2, Q3, Q4, resistors R1, R2, R3, and R4 are the same as the configurations of the corresponding components in the embodiment, and therefore the explanation will be omitted. The switch elements Q6, Q8, and Q9 are N-type MOSFETs. The switch element Q7 is a P-type MOSFET.

The first end of the switch element Q6 is coupled to the constant voltage source V2 by way of the switch element Q7. The gate of the switch element Q6 is coupled to the node N6. The second end of the switch element Q6 is coupled to the node N4.

The first end of the switch element Q7 is coupled to the constant voltage source V2. A signal EN2 is input to the gate of the switch element Q7. The second end of the switch element Q7 is coupled to the first end of the switch element Q6. When an "H"-level signal EN2 is input, the switch element Q7 is switched to the OFF state. When an "L"-level signal EN2 is input, the switch element Q7 is switched to the ON state.

The first end of the switch element Q8 is coupled to the node N6. The gate of the switch element Q8 is coupled to the node N7. The second end of the switch element Q8 is grounded by way of the terminal PG.

The first end of the switch element Q9 is coupled to the node N1. A signal EN1 is input to the gate of the switch element Q9. The second end of the switch element Q9 is grounded by way of the terminal PG. When an "H"-level signal EN1 is input, the switch element Q9 is switched to the ON state. When an "L"-level signal EN1 is input, the switch element Q9 is switched to the OFF state.

The resistor R5 is coupled between the node N6 and the constant voltage source V3.

The resistor R6 is coupled between the second end of the switch element Q9 and the node N7.

The resistor R7 is coupled between the node N7 and the terminal PG.

The constant voltage source V2 outputs a voltage VBIAS2 to the first end of the switch element Q7. The voltage VBIAS2 is higher than the threshold voltage Vth (Q4) of the switch element Q4.

The constant voltage source V3 outputs a voltage VBIAS3 to the node N6 by way of the resistor R5. The voltage VBIAS3 is higher than the voltage VBIAS2 and lower than the voltage VIN.

The absolute value of the threshold voltage Vth(Q6) of the switch element Q6 (hereinafter simply referred to as "threshold voltage Vth(Q6)") is lower than the difference voltage (VBIAS3−VBIAS2) obtained by subtracting the voltage VBIAS2 from the voltage VBIAS3.

The threshold voltages of the switch elements Q6 and Q7 are negligibly small with respect to the voltage VBIAS2, and therefore the voltage drop relating to the threshold voltages of the switch elements Q6 and Q7 can be practically negligible.

2.2 Operation.

Figure 4:
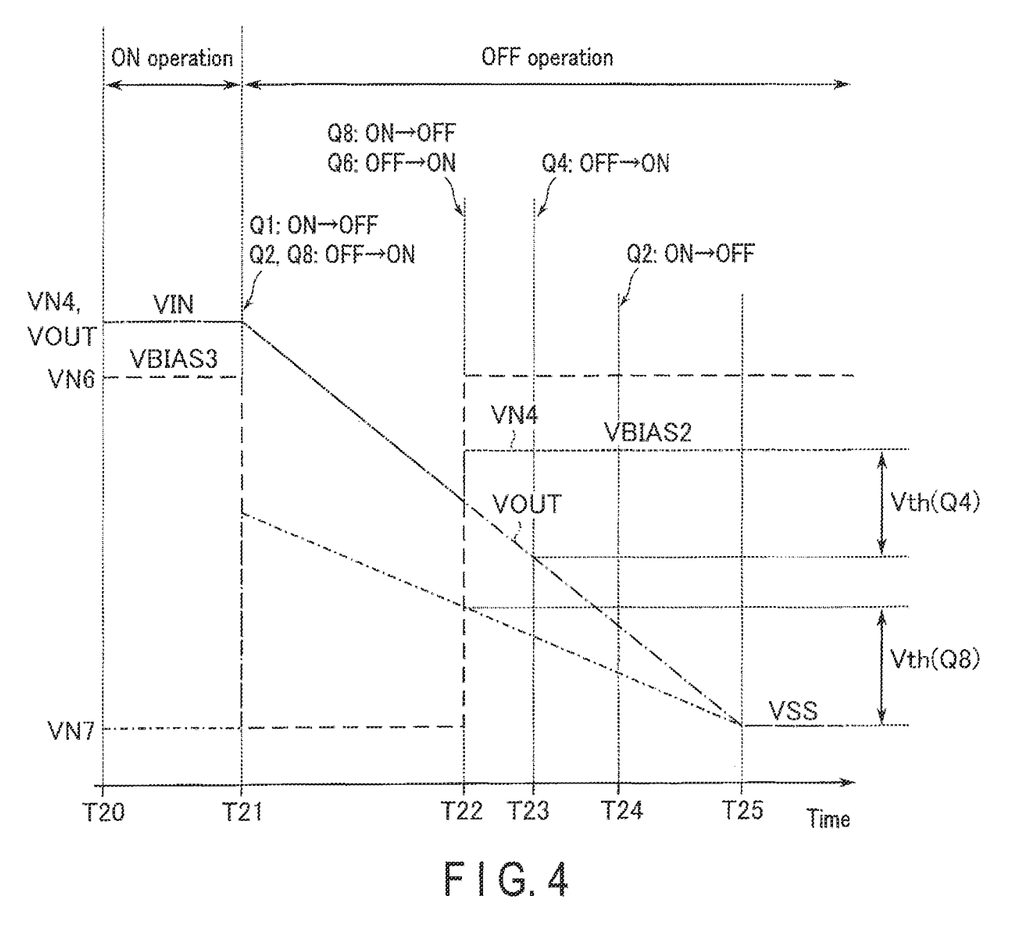
FIG. 4 is a timing chart for an exemplary operation using the semiconductor device according to the modification example.

The semiconductor device 1 according to the modification example will be explained with reference to FIG. 4, which is a timing chart of an exemplary operation using the semiconductor device 1 according to the modification example. In FIG. 4, the operation of the semiconductor device 1 receiving an OFF-operation command CMD after receiving an ON-operation command CMD is illustrated. The voltage VN1, potential difference VGS(Q2), and signals EN1 and EN2 demonstrate basically the same changes as in the embodiment. The voltage VN1, potential difference VGS(Q2), and signals EN1 and EN2 are therefore omitted from FIG. 4.

At time T20, the semiconductor device 1 receives an ON-operation command CMD. The semiconductor device 1 drives the load 2, based on the received ON-operation command CMD.

In particular, in the same manner as the voltage generation circuit 11 according to the embodiment at time T10, the voltage generation circuit 11 outputs a voltage VGATE to the node N1 in response to the command from the control circuit 10.

Furthermore, in the same manner as the control circuit 10 according to the embodiment at time T10, the control circuit 10 generates an "L"-level signal EN1 in response to the ON-operation command CMD. Based on the "L"-level signal EN1, the switch element Q2 enters the OFF state in the same manner as the switch element Q2 according to the embodiment at time T10.

Based on the "L"-level signal EN1, the switch element Q9 enters the OFF state. The voltage VN7 at the gate of the switch element Q8 (i.e., at the node N7) thereby becomes approximately the same as the ground potential VSS. The switch element Q8 therefore enters the OFF state. As a result, the voltage VBIAS3 is applied to the node N6 by the constant voltage source.

Furthermore, in the same manner as in the control circuit 10 according to the embodiment at time T10, the control circuit 10 generates an "H"-level signal EN2 based on the ON-operation command CMD. Based on the "H"-level signal EN2, the switch element Q7 enters the OFF state. The voltage VN4 at the node N4 thereby becomes approximately the same as the voltage VOUT. The switch element Q4 therefore enters the OFF state.

As described above, in the ON operation, the switch elements Q2 and Q4 enter the OFF state, which electrically insulates the node N1 and terminal PVOUT from each other. As a result, the switch element Q1 enters the ON state, based on the voltage VGATE applied to the node N1 by the voltage generation circuit 11.

At time T21, the semiconductor device 1 receives an OFF-operation command CMD. The semiconductor device 1 interrupts the driving of the load 2, based on the received OFF-operation command CMD.

In particular, in the same manner as the voltage generation circuit 11 according to the embodiment at time T11, the voltage generation circuit 11 stops generating the voltage VGATE. As a result, in the same manner as at time T11 according to the embodiment, the voltage VN1 begins to drop.

Furthermore, in the same manner as the control circuit 10 according to the embodiment at time T11, the control circuit 10 generates an "H"-level signal ENI based on the OFF-operation command CMD. In the same manner as the switch element Q2 according to the embodiment at time T11, the switch element Q2 is switched from the OFF state to the ON state based on the "H"-level signal ENI (Q2: OFF→ON in FIG. 4). The node N1 and terminal PVOUT are thereby coupled to each other by way of the switch element Q2, and the voltages VOUT and VN4 begin to drop in accordance with the lowering of the voltage VN1.

Furthermore, the switch element Q9 enters the ON state based on the "H"-level signal EN1. When the switch element Q9 is in the ON state, the voltage at the node N7 is expressed by using the voltage VN1 and the resistance values r6 and r7 of the resistors R6 and R7 as voltage (VN1×r7/(r6+r7)). The voltage VN1 immediately after switching from the ON operation to the OFF operation is approximately equal to the voltage VGATE. The voltage VN7 at the node N7 is therefore expressed as voltage (VGATE×r7/(r6+r7)). The threshold voltage Vth(Q8) of the switch element Q8 satisfies the expression (3) below. That is, the threshold voltage Vth(Q8) of the switch element Q8 is higher than the voltage VN7 at the node N7 immediately after switching from the ON operation to the OFF operation. This switches the switch element Q8 from the OFF state to the ON state (Q8: OFF→ON in FIG. 4). The node N6 is therefore grounded by way of the switch element Q8 and terminal PG. This means that the voltage VN6 at the node N6 becomes approximately the same as the ground potential VSS.

$$\text{Vth(Q8) VGATE} \times r7/(r6+r7) \tag{3}$$

In the same manner as the control circuit 10 according to the embodiment at time T11, the control circuit 10 generates an "L"-level signal EN2, based on the OFF-operation command CMD. Based on the "L"-level signal EN2, the switch element Q7 enters the ON state. As a result, the voltage VBIAS2 is applied to the first end of the switch element Q6.

As discussed above, at time T21, the voltage VBIAS2 and ground potential VSS are applied to the first end of the switch element Q6 and the gate of the switch element Q6 (i.e., node N6), respectively. The switch element Q6 thereby enters the OFF state. The voltage VN4 is therefore approximately the same as the voltage VOUT, and the switch element Q4 is in the OFF state.

As described above, the node N1 and terminal PVOUT are electrically coupled to each other by way of the switch element Q2. In other words, in accordance with the switch element Q2 entering the ON state, the switch element Q1 is switched from the ON state to the OFF state (Q1: ON→OFF in FIG. 2).

At time T22, in accordance with the lowering of the voltage VN1, the voltage VN7 becomes lower than the threshold voltage Vth(Q8) of the switch element Q8. That is, the switch element Q8 is switched from the ON state to the OFF state (Q8: ON→OFF in FIG. 4). As a result, the voltage VN6 becomes approximately the same as the voltage VBIAS3. As described above, the voltage VBIAS2 is applied to the first end of the switch element Q6 by way of the ON-state switch element Q7. This switches the switch element Q6 from the OFF state to the ON state (Q6: OFF→ON in FIG. 4). Thus, the voltage VBIAS2 is applied to the node N4 by way of the switch elements Q6 and Q7 (which means that the voltage VN4 is approximately equal to the voltage VBIAS2). The potential difference VGS(Q4) becomes approximately the same as the difference voltage (VBIAS2−VOUT) obtained by subtracting the voltage VOUT from the voltage VBIAS2.

At time T23, in accordance with the lowering of the voltage VOUT, the difference voltage (VBIAS2−VOUT) becomes higher than the threshold voltage Vth(Q4) of the switch element Q4. The switch element Q4 is therefore switched from the OFF state to the ON state (Q4: OFF→ON in FIG. 4). The node N1 and terminal PVOUT are therefore electrically coupled to each other by way of the switch element Q4 in addition to the switch element Q2. With the switch elements Q2 and Q4 being in the ON state, the switch element Q1 enters the OFF state.

In the same manner as the switch element Q2 according to the embodiment at time T14, the switch element Q2 enters from the ON state to the OFF state (Q2: ON→OFF in FIG. 4) at time T24. On the other hand, the potential difference VGS(Q4) (difference voltage (VBIAS2−VOUT)) increases in accordance with the decrease in the voltage VOUT. As a result, the switch element Q4 is maintained in the ON state. The node N1 and terminal PVOUT are therefore electrically coupled to each other by way of the switch element Q4. With the switch element Q4 being in the ON stag, the switch element Q1 is maintaidned in the OFF state.

At time T25, the voltages VN1 and VOUT both become approximately the same as the ground potential VSS.

As described above, the semiconductor device 1 switches the switch elements Q2 and Q4 into the OFF state based on the ON-operation command CMD so as to turn the switch element Q1 to the ON state. Furthermore, based on the OFF-operation command CMD, the semiconductor device 1 switches at least one of the switch elements Q2 and Q4 to the ON state so as to switch the switch element Q1 to the OFF state.

2.3 Effects of Modification Example

The semiconductor device 1 according to the above modification example can achieve approximately the same effects as the semiconductor device 1 according to the present embodiment.

Furthermore, during the OFF operation, when the switch elements Q6 and Q7 are both switched to the ON state in the semiconductor device 1 according to the modification example, the voltage VBIAS2 output from the constant voltage source V2 is applied to the gate of the switch element Q4 (i.e., the node N4). In other words, the voltage VBIAS2 output from the constant voltage source V2 is applied to the node N4, without being substantially affected by the voltage drop. In the modification example, the influence of the voltage drop on the voltage to be applied to the node N4 can be suppressed, and the voltage VOUT (i.e., the voltage at the second end of the switch element Q4) at the time of the switch element Q4 switching from the OFF state to the ON state can be prevented from falling. Thus, during the OFF operation, a reduction in the time range of the switch element Q4 being in the ON state can be avoided, and in this manner the unintended output of a voltage from the semiconductor device 1 for driving the load 2 external to the semiconductor device 1 can be reliably prevented.

To be more specific, the switch element Q4 in the modification example enters the ON state based on the potential difference VGS(Q4). The potential difference VGS(Q4) is a difference voltage (VN4−VOUT) obtained by subtracting the voltage VOUT from the voltage VN4. This means that the higher the voltage VN4, the higher the voltage VOUT at which the switch element Q4 is switched from the OFF state to the ON state can be set. In the semiconductor device 1 according to the modification example, the voltage VBIAS2 of the constant voltage source V2 applied, with almost no reduction, to the node N4. Thus, in the semiconductor device 1 according to the modification example, in comparison with the case of the constant voltage supply applying to the node N4 a voltage that has been reduced (i.e., the case of the voltage of the constant voltage source beings, reduced), the switch element Q4 can be switched from the OFF state to the ON state at a time point of the voltage VOLT being high.

In addition, even if the voltage VBIAS2 of the constant voltage source V2 is set to be lower in comparison with the case of the voltage of the constant voltage supply being reduced, the semiconductor device 1 according to the modification example can realize the voltage VOUT that determines the switching of the switch element Q4 from the OFF state to the ON state, at approximately the same level as in the case of the voltage of the constant voltage supply being reduced. That is, during the OFF operation, the voltage VBIAS2 of the constant voltage source V2 can be set to be low in comparison with the case of the voltage of the constant voltage source being reduced, while minimizing the reduction in the period of time in which the switch element Q4 maintains the ON state.

3. Others

In the embodiment and modification example, the switch element Q1 is included in the switching circuit 12 of the semiconductor device 1; however, the configuration is not limited thereto. The switch element Q1 may be provided external to the semiconductor device 1.

An example of the switch element Q1 provided external to the semiconductor device 1 will be explained with reference to FIG. 5, which is a circuit diagram for explaining an exemplary configuration of a semiconductor device according to another modification example, a switch element, and a load driven by the semiconductor device and switch element.

A semiconductor device 1 according to this modification example may include a terminal PVGATE. The semiconductor device 1 according to the modification example is coupled, for example by way of the terminal PVIN, to the first end of the switch element Qi external to the semiconductor device 1. The semiconductor device 1 according to the modification example is also coupled, for example by way of the terminal PVGATE, to the gate of the switch element Q1 external to the semiconductor device 1. The semiconductor device 1 according to the modification example is further coupled, for example by way of the terminal PVOUT, to the second end of the switch element Q1 external to the semiconductor device 1.

The operation of the semiconductor device 1 according to the modification example is the same as the operation of the semiconductor device 1 according to the present embodiment, and therefore the explanation is omitted.

With such a configuration, the same effects as in the embodiment can be achieved.

Figure 5:
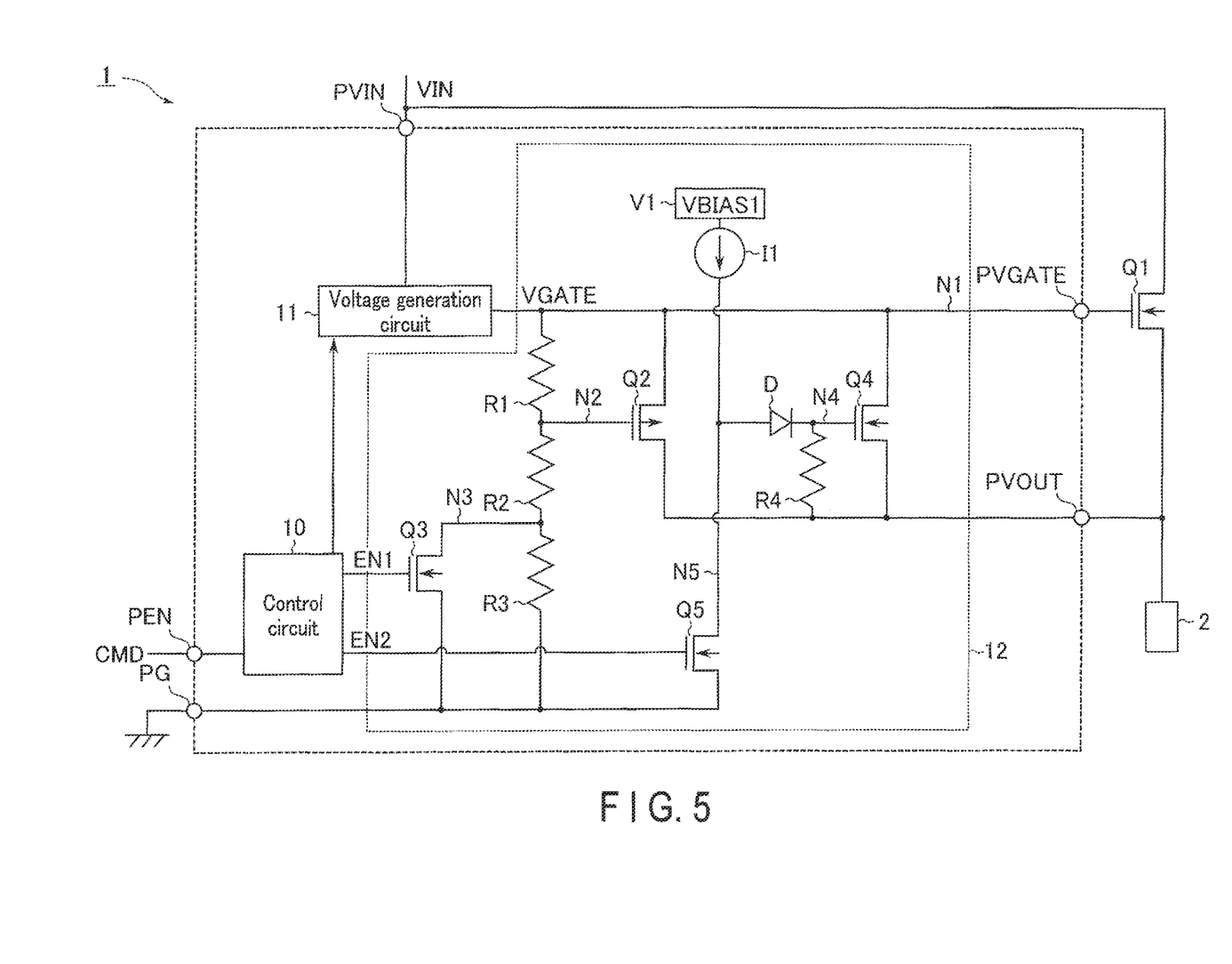
FIG. 5 is a circuit diagram for explaining an exemplary configuration of a semiconductor device according to another modification example, a switch element, and a load driven by the semiconductor device and switch element.

In the example of FIG. 5, the semiconductor device 1 includes the same configuration as the switching circuit 12 according to the embodiment; however, the configuration is not limited thereto. The semiconductor device 1 according to this modification example may include the same configuration as the switching circuit 12 according to the aforementioned modification example. With such a configuration, the same effects can be achieved.

The embodiments of the present invention have been explained. These are presented merely as examples and are not intended to restrict the scope of the invention. These embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

The invention claimed is:

1. A semiconductor device comprising:
    a first terminal;
    a second terminal; and
    a first circuit,
    wherein the first circuit comprises:
        a first switch element having a first end coupled to a first node to which a first voltage is supplied, a second end coupled to the first terminal, and a gate coupled to a node between the first node and the second terminal; and
        a second switch element coupled between the first node and the first terminal in parallel with the first switch element, and having a gate coupled to the first terminal, and
    wherein the first circuit is configured to:
        switch the first switch element from an OFF state to an ON state when supply of the first voltage to the first node is interrupted, and
        switch the second switch element from the OFF state to the ON state while maintaining the first switch element in the ON state when a voltage of the first terminal changes to a second voltage that is lower than the first voltage.

2. The device of claim 1, further comprising:
a second circuit;
a first resistor coupled between the first node and the gate of the first switch element;
a second resistor and a third resistor serially coupled between the gate of the first switch element and the second terminal; and
a third switch element having a first end coupled to a node between the second resistor and the third resistor, and a second end coupled to the second terminal,
wherein the second circuit switches the third switch element from the OFF state to the ON state when the supply of the first voltage to the first node is interrupted.

3. The device of claim 2, further comprising:
a diode having a first end to which a third voltage is applied, and a second end coupled to the gate of the second switch element;
a fourth resistor having a first end coupled between to the gate of the second switch element and the second end of the diode, and a second end coupled to the first terminal; and
a fourth switch element having a first end coupled to the first end of the diode and a second end coupled to the second terminal,
wherein the second circuit switches the fourth switch element from the ON state to the OFF state when the supply of the first voltage to the first node is interrupted.

4. The device of claim 2, further comprising:
a third circuit coupled to the first terminal and the first node,
wherein the third circuit supplies a third voltage to the first terminal when a voltage of the first node changes to a fourth voltage that is lower than the first voltage.

5. The device of claim 4, wherein the third circuit comprises:
a fourth switch element having a first end coupled to the first node and a second end coupled to the second terminal;
a fourth resistor and a fifth resistor serially coupled between the second end of the fourth switch element and the second terminal;

a first constant voltage source configured to supply the third voltage;
a fifth switch element having a first end coupled to the first terminal, a second end, and a gate to which a fifth voltage is applied;
a sixth switch element having a first end coupled to the second end of the fifth switch element and a second end coupled to the first constant voltage source; and
a seventh switch element having a first end coupled to the gate of the fifth switch element, a second end coupled to the second terminal, and a gate coupled between the fourth resistor and the fifth resistor,
wherein the third circuit switches the fourth switch element and the sixth switch element from the OFF state to the ON state when the supply of the first voltage to the first node is interrupted.

6. The device of claim 5, wherein
the fifth voltage is higher than the third voltage.

7. The device of claim 6, wherein
a threshold voltage of the fifth switch element is lower than a voltage obtained by subtracting the third voltage from the fifth voltage.

8. The device of claim 5, wherein
the second circuit instructs the third circuit to switch the fourth switch element and the sixth switch element from the OFF state to the ON state.

9. The device of claim 5, wherein
the first end of the fifth switch element is coupled to the first terminal by way of a sixth resistor.

10. The device of claim 2, further comprising:
a third circuit configured to generate the first voltage and output the generated first voltage to the first node,
wherein the second circuit instructs the third circuit to stop outputting the first voltage.

11. The device of claim 1, further comprising:
a third terminal to which a third voltage is supplied from outside of the semiconductor device; and
a third switch element having a first end coupled to the third terminal, a second end coupled to the first terminal, and a gate coupled to the first node.

12. The device of claim 1, further comprising:
a third terminal coupled to the first node.

13. The device of claim 1, wherein
the second terminal is grounded.

* * * * *